United States Patent
Zou et al.

(10) Patent No.: US 10,802,217 B2
(45) Date of Patent: Oct. 13, 2020

(54) OPTICAL WAVEGUIDE STRUCTURE AND MANUFACTURING METHOD THEREOF

(71) Applicant: National Sun Yat-sen University, Kaohsiung (TW)

(72) Inventors: Jia-Ren Zou, Kaohsiung (TW); Yi-Jen Chiu, Kaohsiung (TW); Rih-You Chen, Kaohsiung (TW); Cong-Long Chen, Kaohsiung (TW)

(73) Assignee: NATIONAL SUN YAT-SEN UNIVERSITY, Kaohsiung (TW)

( * ) Notice: Subject to any disclaimer, the term of this patent is extended or adjusted under 35 U.S.C. 154(b) by 0 days.

(21) Appl. No.: 16/402,452

(22) Filed: May 3, 2019

(65) Prior Publication Data
US 2020/0284982 A1    Sep. 10, 2020

(30) Foreign Application Priority Data
Mar. 6, 2019   (TW) .............................. 108107503 A (51) Int. Cl.
*G02B 6/132* (2006.01)
*G02B 6/122* (2006.01)
*G02B 6/12* (2006.01)

(52) U.S. Cl.
CPC ............ *G02B 6/132* (2013.01); *G02B 6/122* (2013.01); *G02B 2006/12107* (2013.01); *G02B 2006/12128* (2013.01)

(58) Field of Classification Search
None
See application file for complete search history.

(56) References Cited

U.S. PATENT DOCUMENTS

| | | | |
|---|---|---|---|
| 2005/0271092 A1 | 12/2005 | Ledentsov et al. | |
| 2006/0262823 A1 | 11/2006 | Sugimoto et al. | |
| 2007/0263953 A1* | 11/2007 | Thapliya | G02F 1/3132 385/4 |
| 2009/0110356 A1* | 4/2009 | Xiang | G02B 6/10 385/129 |
| 2010/0224248 A1* | 9/2010 | Kenney | H01L 31/055 136/259 |
| 2012/0106583 A1 | 5/2012 | Watson et al. | |
| 2014/0035836 A1 | 2/2014 | Cui Xiquan et al. | |

FOREIGN PATENT DOCUMENTS

| | | |
|---|---|---|
| TW | 557618 B | 10/2003 |
| TW | 200603401 A | 1/2006 |
| WO | 2014025670 A1 | 2/2014 |

* cited by examiner

*Primary Examiner* — Jerry Rahll
(74) *Attorney, Agent, or Firm* — Muncy, Geissler, Olds & Lowe, P.C.

(57) ABSTRACT

An optical waveguide structure and a manufacturing method thereof are provided. The optical waveguide structure includes: a substrate; a first-type semiconductor conductive layer disposed on the substrate; a first confining layer disposed on the first-type semiconductor conductive layer; a waveguide layer disposed on the first confining layer and including a luminescent material; a polymer filling layer disposed on the first confining layer and adjacent to the waveguide layer, wherein the viscosity of the polymer filling layer is less than 52 mm$^2$/s; a second confining layer disposed on the waveguide layer and the polymer filling layer; a cladding layer disposed on the second confining layer; and a second-type semiconductor conductive layer disposed on the cladding layer.

10 Claims, 7 Drawing Sheets

OPTICAL WAVEGUIDE STRUCTURE AND MANUFACTURING METHOD THEREOF

CROSS REFERENCE TO RELATED APPLICATIONS

This application claims the priority of Taiwan Patent Application No. 108107503, filed on Mar. 6, 2019, titled "OPTICAL WAVEGUIDE STRUCTURE AND MANUFACTURING METHOD THEREOF", and the disclosure of which is incorporated herein by reference.

FIELD OF INVENTION

The present invention relates to a field of a waveguide structure and manufacturing method thereof, and more particularly, to an optical waveguide structure with a hybrid type and high confinement efficiency and a manufacturing method thereof.

BACKGROUND OF INVENTION

Because rapid growth of network and a great increase in transmitted data, optical communication is the major development in recent years. However, the development of existing optical waveguide structure can be roughly divided into two types: horizontal integration (2D integrated) and vertical integration (3D integrated).

The current of 2D integrated type is transmitted horizontally. Taking US Patent Application No. US2012/0106583 as an example. 2D integrated type requires a larger footprint. In addition, manufacturing processes of horizontal integration are complicated, for example, repeatedly forming epitaxial films with different types (N-type, P-type) in different regions, and repeated alignment, lithography, and etching those epitaxial films. Therefore, it is difficult to integrate vertically with devices having different functions. The current of 3D integrated type is transmitted vertically, and 3D integrated type has a smaller footprint. However, the vertical integration type still has some problems, such as insufficient limitation of a light field, or energy consumption. Those problems result that 3D integrated type is still not actually applicable.

Therefore, it is necessary to provide an optical waveguide structure and a manufacturing method thereof to solve the problems in the conventional technology.

SUMMARY OF INVENTION

A primary object of the present disclosure is to provide an optical waveguide structure with well limitation of the light field, and to reduce the footprint of the optical waveguide structure. Thereby, the optical waveguide structure facilitates to vertically integrate with other devices having different functions.

A secondary object of the present disclosure is to provide a manufacturing method of an optical waveguide structure, so as to simplify manufacturing steps for optical waveguide structure. And thereby obtain an optical waveguide structure with well limitation of the light field.

In order to achieve the above objects, the present disclosure provides an optical waveguide structure, the optical waveguide structure includes: a substrate; a first-type semiconductor conductive layer disposed on the substrate; a first confining layer disposed on the first-type semiconductor conductive layer; a waveguide layer disposed on the first confining layer, and comprising a luminescent material; a polymer filling layer disposed on the first confining layer and adjacent to the waveguide layer, wherein a viscosity of the polymer filling layer is less than 52 $mm^2/s$; a second confining layer disposed on the waveguide layer and the polymer filling layer; a cladding layer disposed on the second confining layer; and a second-type semiconductor conductive layer disposed on the cladding layer.

In one embodiment of the present disclosure, the material of the polymer filling layer comprises poly(methyl glutarimide).

In one embodiment of the present disclosure, the material of the substrate comprises silicon, and the luminescent material comprises a III-V compound.

In one embodiment of the present disclosure, the luminescent material comprises multiple quantum wells.

In one embodiment of the present disclosure, the second-type semiconductor conductive layer is located within a vertical projection region of the polymer filling layer.

The present disclosure further provides a manufacturing method of an optical waveguide structure, including steps of: providing a substrate and an optical waveguide substrate, wherein the optical waveguide substrate sequentially comprises: a first-type semiconductor conductive layer, a first confining layer, a waveguide layer, a second confining layer, a cladding layer, and a second-type semiconductor conductive layer; bonding the substrate and the optical waveguide substrate, wherein the first-type semiconductor conductive layer is adjacent to the substrate; forming a recess in a side of the waveguide layer; defining an optical waveguide region, and removing the first-type semiconductor conductive layer, the first confining layer, the waveguide layer, the second confining layer and the cladding layer disposed outside the optical waveguide region; and filing a polymer filling layer into the recess, wherein a viscosity of the polymer filling layer is less than 52 $mm^2/s$.

In one embodiment of the present disclosure, the step of forming the recess in the side of the waveguide layer includes a step of: forming the recess by an etching technique, wherein an etching rate of the etching technique to the waveguide layer is greater than an etching rate of the etching technique to the first confining layer.

In one embodiment of the present disclosure, the step of bonding the substrate and the optical waveguide substrate includes steps of: coating a bonding material on the substrate, wherein the bonding material comprises benzocyclobutene; and placing the optical waveguide substrate on the bonding material, and applying a bonding pressure onto the optical waveguide substrate.

In one embodiment of the present disclosure, before forming the recess by the etching technique, further includes a step of: forming a silicon dioxide layer on the cladding layer and the second-type semiconductor conductive layer.

In one embodiment of the present disclosure, the step of forming the recess in the side of the waveguide layer includes a step of: ensuring the recess corresponding to the second-type semiconductor conductive layer and under the second-type semiconductor conductive layer.

As described above, the present disclosure reduces the waveguide layer by an undercut recess formed by the etching technique, so that an optical waveguide structure with well limitation of the light field is provided. Further, forming the undercut recess through different etching rates can also reduce the difficulty for shrinking the waveguide layer. Moreover, the footprint of the optical waveguide structure can be further reduced.

DESCRIPTION OF DRAWINGS

In order to more clearly illustrate the technical solutions in the embodiments or the prior art, the following drawings, which are intended to be used in the description of the embodiments or the prior art, will be briefly described. It will be apparent that the drawings and the following description are only some embodiments of the present invention. Those of ordinary skill in the art may, without creative efforts, derive other drawings from these drawings.

DETAILED DESCRIPTION OF PREFERRED EMBODIMENTS

In the following detailed description of the preferred embodiments, reference is made to the accompanying drawings which form a part hereof, and in which is shown by way of illustration specific embodiments in which the invention may be practiced. In this regard, directional terminology, such as "top", "bottom", "front", "back", "left", "right", "inside", "outside", "side", etc., is used with reference to the orientation of the figure(s) being described. As such, the directional terminology is used for purposes of illustration and is in no way limiting. Throughout this specification and in the drawings like parts will be referred to by the same reference numerals.

Figure 1:
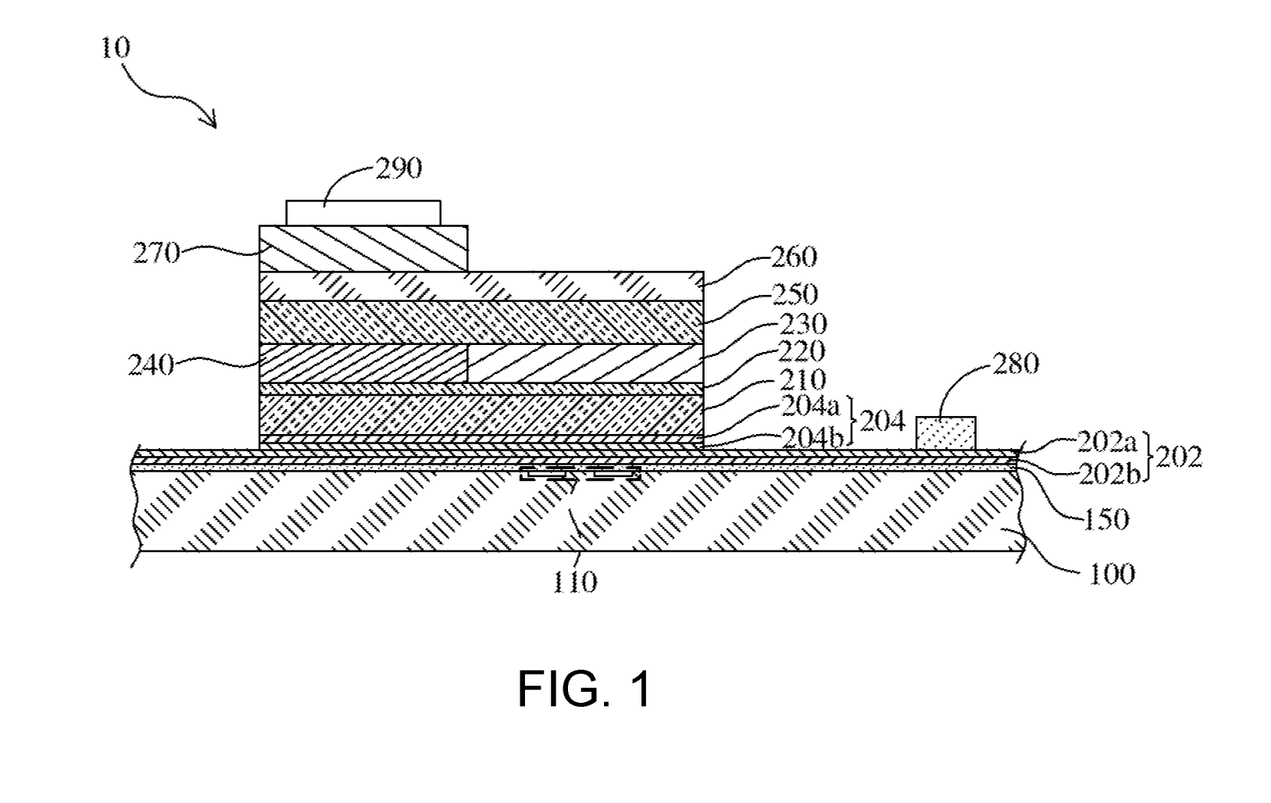
FIG. 1 is a structural schematic diagram of an optical waveguide structure according to an embodiment of the present disclosure.

Please refer to FIG. 1. FIG. 1 is a structural schematic diagram of an optical waveguide structure according to an embodiment of the present disclosure. The embodiment provides an optical waveguide structure 10, the optical waveguide structure includes: a substrate 100, a first-type semiconductor conductive layer 210, a first confining layer 220, a waveguide layer 230, a polymer filling layer 240, a second confining layer 250, a cladding layer 260, a second-type semiconductor conductive layer 270, a first electrode 280, and a second electrode 290.

The substrate 100 includes a grating 110. Material of the substrate 100 includes silicon, and the substrate 100 may be a silicon-on-insulator (SOI) wafer or any other feasible substrate. A bonding layer 150 is disposed on the substrate 100 for adhering the first-type semiconductor conductive layer 210. The bonding layer 150 can be made of a polymer material, such as benzocyclobutene (BCB).

The first-type semiconductor conductive layer 210 is disposed on the bonding layer 150 of the substrate 100. A first contact layer 202 and a second contact layer 204 are disposed between the bonding layer 150 and the first-type semiconductor conductive layer 210. Material of the first-type semiconductor conductive layer 210 may be an N-type III-V compound, such as N-type indium phosphide (N—InP). The first contact layer 202 and the second contact layer 204 can help current more efficiently enter the first-type semiconductor conductive layer 210. Accordingly, material of the first contact layer 202 and the second contact layer 204 may be an N-type semiconductor. The first contact layer 202 and the second contact layer 204 may respectively be a layered structure, for example, the first contact layer 202 includes a film layer 202a and a film layer 202b, and the second contact layer 204 includes a film layer 204a and a film layer 204b. Material of the film layer 202a and the film layer 204a may be an N—InP. Material of the film layer 202b and the film layer 204b may be N-type indium gallium arsenide phosphide (N—InGaAsP). It should be understood that the material of the first-type semiconductor conductive layer 210 may also be a P-type semiconductor, then, correspondingly a P-type semiconductor may be selected as the materials of the first contact layer 202 and of the second contact layer 204.

The first confining layer 220 is disposed on the first-type semiconductor conductive layer 210. Material of the first confining layer 220 may be a semiconductor, such as a III-V compound.

The waveguide layer 230 is disposed on the first confining layer 220, and includes a luminescent material (not show). The waveguide layer 230 corresponds to the grating 110, and is disposed above the grating 110. The luminescent material may include a III-V compound, such as indium gallium arsenide phosphide (InGaAsP) or aluminum indium gallium arsenide (AlInGaAs). The luminescent material may also include multiple quantum wells (MQWs).

The polymer filing layer 240 is disposed on the first confining layer 220 and is adjacent to the waveguide layer 230, wherein a viscosity of the polymer filling layer 240 is less than 52 mm$^2$/s. Material of the polymer filling layer 240 may include poly(methyl glutarimide) (PMGI). The polymer filling layer 240 is configured to support the second confining layer 250, the cladding layer 260, the second-type semiconductor conductive layer 270, and the first electrode 280, thereby maintaining the optical waveguide structure 10.

The second confining layer 250 is disposed on the waveguide layer 230 and the polymer filling layer 240. The second confinement layer 250 may include a semiconductor material, such as a III-V compound.

The cladding layer 260 is disposed on the second confining layer 250. The cladding layer 260 may include a III-V compound, such as a P-type indium phosphide (P—InP).

The second-type semiconductor conductive layer 270 is disposed on the cladding layer 260, wherein the second-type semiconductor conductive layer 270 is located within a vertical projection region of the polymer filling layer 240. Material of the second-type semiconductor conductive layer 270 may be a P-type III-V compound, such as a P—InP. The second-type semiconductor conductive layer 270 and the first-type semiconductor conductive layer 210 may be semiconductor materials with different doping types.

The first electrode 280 is disposed on the first contact layer 202 and the second electrode 290. The first electrode 280 and the second electrode 290 may be a single-layer metal or a multi-layer metal. The material of the first electrode 280 and the second electrode 290 may include Ti, Pt, Au, Ni or other feasible metals. Material of the first electrode 280 and the second electrode 290 can be adjusted according to the material of the first contact layer 202 and the second-type semiconductor conductive layer 270, for example, the first electrode 280 is a multi-layer metal of Ni/AuGe/Ni/Au, and the second electrode 290 is a multi-layer metal of Ti/Pt/Au.

Figure 2:
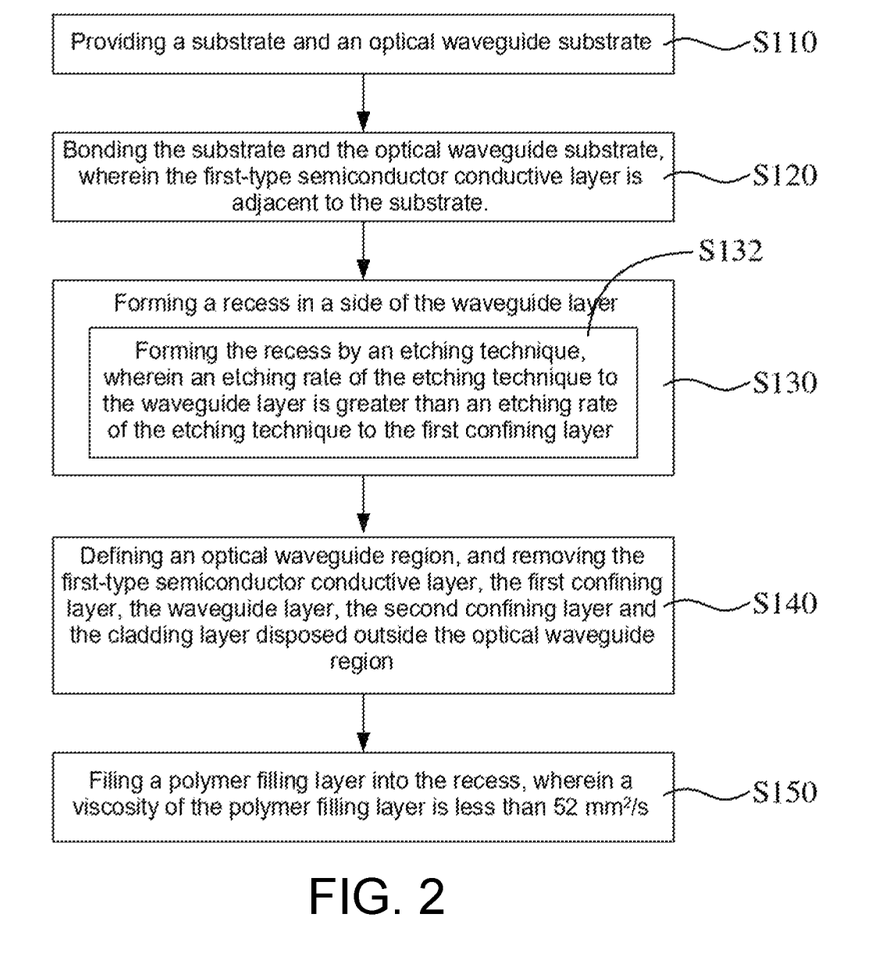
FIG. 2 is a flow chart of a manufacturing method of an optical waveguide structure according to an embodiment of the present disclosure.

Please refer to FIG. 2. FIG. 2 is a flow chart of a manufacturing method of an optical waveguide structure according to an embodiment of the present disclosure. The embodiment of the present disclosure provides a manufacturing method of an optical waveguide structure, including steps of:

Step S110, providing a substrate and an optical waveguide substrate, wherein the optical waveguide substrate sequentially comprises: a first-type semiconductor conductive layer, a first confining layer, a waveguide layer, a second confining layer, a cladding layer, and a second-type semiconductor conductive layer.

Step S120, bonding the substrate and the optical waveguide substrate, wherein the first-type semiconductor conductive layer is adjacent to the substrate. The step of bonding the substrate and the optical waveguide substrate includes steps of: coating a bonding material on the substrate, wherein the bonding material comprises benzocyclobutene; and placing the optical waveguide substrate on the bonding material, and applying a bonding pressure onto the optical waveguide substrate.

Step S130, forming a recess in a side of the waveguide layer. The step 130 includes a step of: forming the recess by an etching technique, wherein an etching rate of the etching technique to the waveguide layer is greater than an etching rate of the etching technique to the first confining layer. Further, before forming the recess by the etching technique, further includes a step of: forming a silicon dioxide layer on the cladding layer and the second-type semiconductor conductive layer. Moreover, the step of forming the recess in the side of the waveguide layer includes a step of: ensuring the recess corresponding to the second-type semiconductor conductive layer and under the second-type semiconductor conductive layer.

Step S140, defining an optical waveguide region, and removing the first-type semiconductor conductive layer, the first confining layer, the waveguide layer, the second confining layer and the cladding layer disposed outside the optical waveguide region.

Step S150, filing a polymer filling layer into the recess, wherein a viscosity of the polymer filling layer is less than 52 mm$^2$/s.

In order to more effectively explain the manufacturing method of the optical waveguide structure according to the present disclosure, please refer to FIGS. 3A to 3E. FIGS. 3A to 3E are schematic diagrams of the manufacturing method according to the embodiment of the FIG. 2.

Figure 3A:
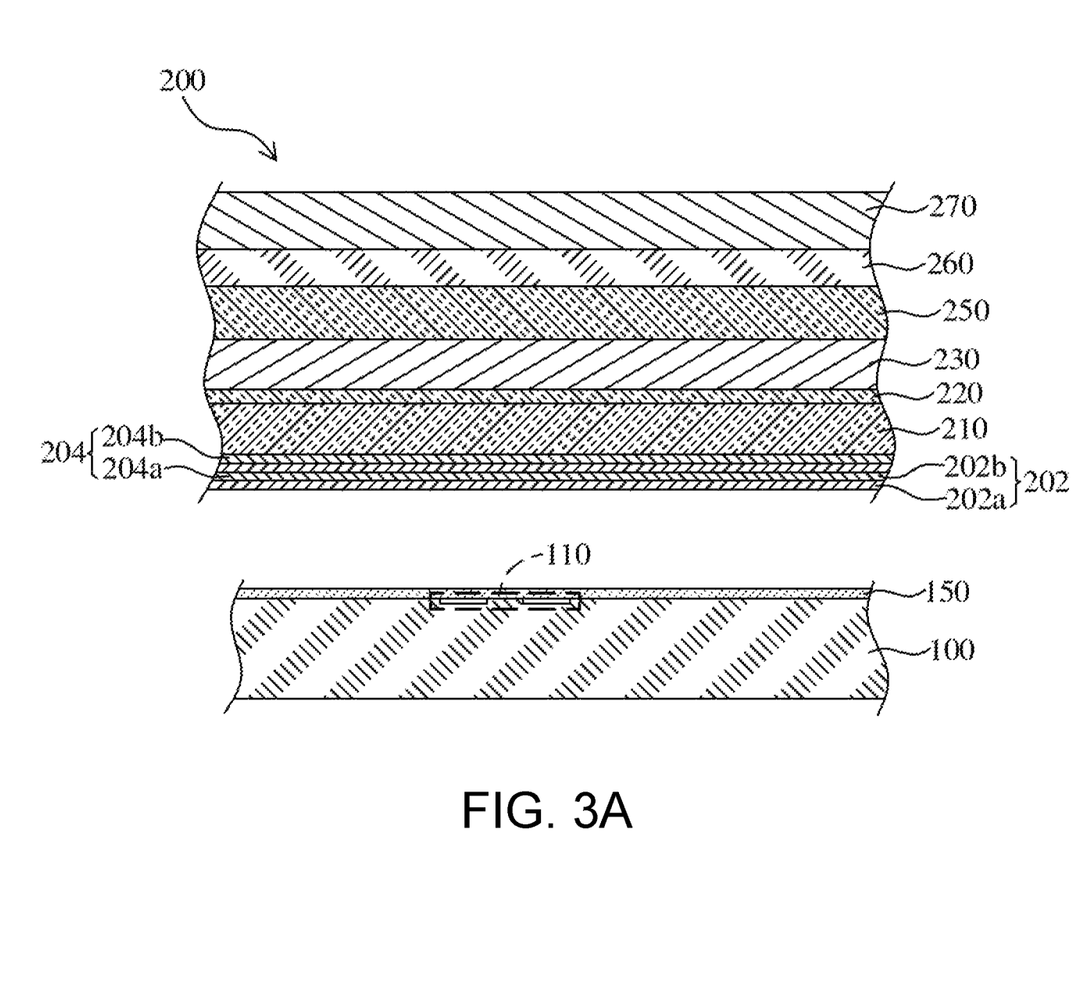
FIGS. 3A to 3E are schematic diagrams of the manufacturing method according to the embodiment in FIG. 2.

As shown in FIG. 3A, a substrate 100 and an optical waveguide substrate 200 are prepared. The substrate 100 is a SOI wafer, and the substrate 100 has a grating 110 disposed on a surface thereof. A bonding layer 150 is coated on a surface of the substrate 100, and the surface has a grating 110. Material of the bonding layer may include BCB or other feasible polymer materials.

The optical waveguide substrate 200 may be a layered structure including III-V compounds. The optical waveguide substrate 200 sequentially includes: a first contact layer 202, a second contact layer 204, a first-type semiconductor conductive layer 210, a first confining layer 220, a waveguide layer 230, a second confining layer 250, a cladding layer 260, and a second-type semiconductor conductive layer 270.

The first contact layer 202 includes a film layer 202a and a film layer 202b. The second contact layer 204 includes a film layer 204a and a film layer 204b. The material of the film layer 202a and the film layer 204a may be N—InP, and the material of the film layer 202b and the film layer 204b may be N—InGaAsP. The material of the first-type semiconductor conductive layer 210 may be an N-type III-V compound, such as N—InP. The waveguide layer 230 includes a luminescent material (not shown). The luminescent material may be InGaAsP or AlInGaAs. The luminescent material may also include MQWs, such as MQWs within InGaAsP. The material of the cladding layer 260 may includes a III-V compound, such as P—InP. The material of the second-type semiconductor conductive layer 270 may be a P-type III-V compound, such as P—InP.

Contacting the first contact layer 202 of the optical waveguide substrate 200 to the bonding layer 150, and bonding the substrate 100 and the optical waveguide substrate 200 by applying a bonding pressure onto the optical waveguide substrate 200 at a working temperature.

Figure 3B:
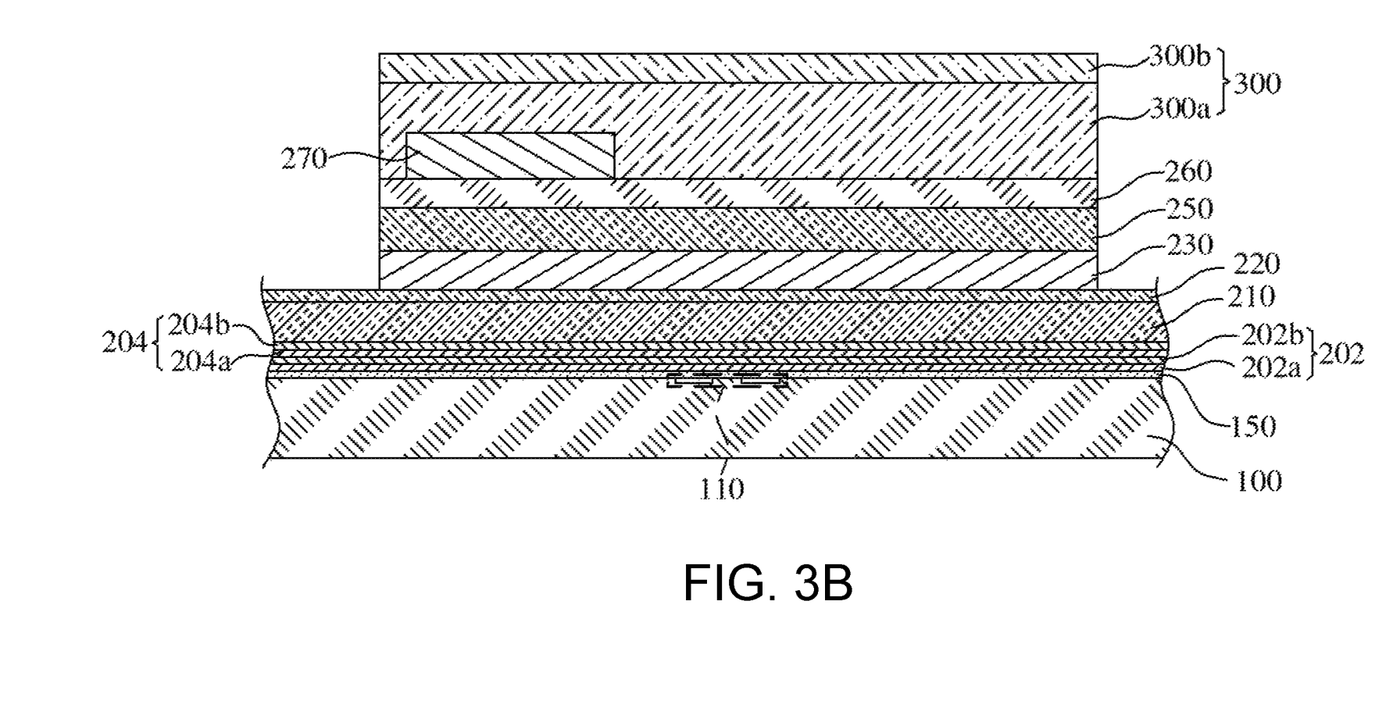

As shown in FIG. 3B, an etching barrier layer 300 is formed after the second-type semiconductor conductive layer 270 is defined. The etching barrier layer 300 may be a layered structure, such as a silicon dioxide layer 300a and a photoresist layer 300b. It should be understood that the material and structure of the etching barrier layer 300 can be adjusted and replaced according to the etching technique. The waveguide layer 230, the second confining layer 250, and the cladding layer 260 are defined by the etching barrier layer 300. Thereby, both sides of the waveguide layer 203 are exposed.

Figure 3C:
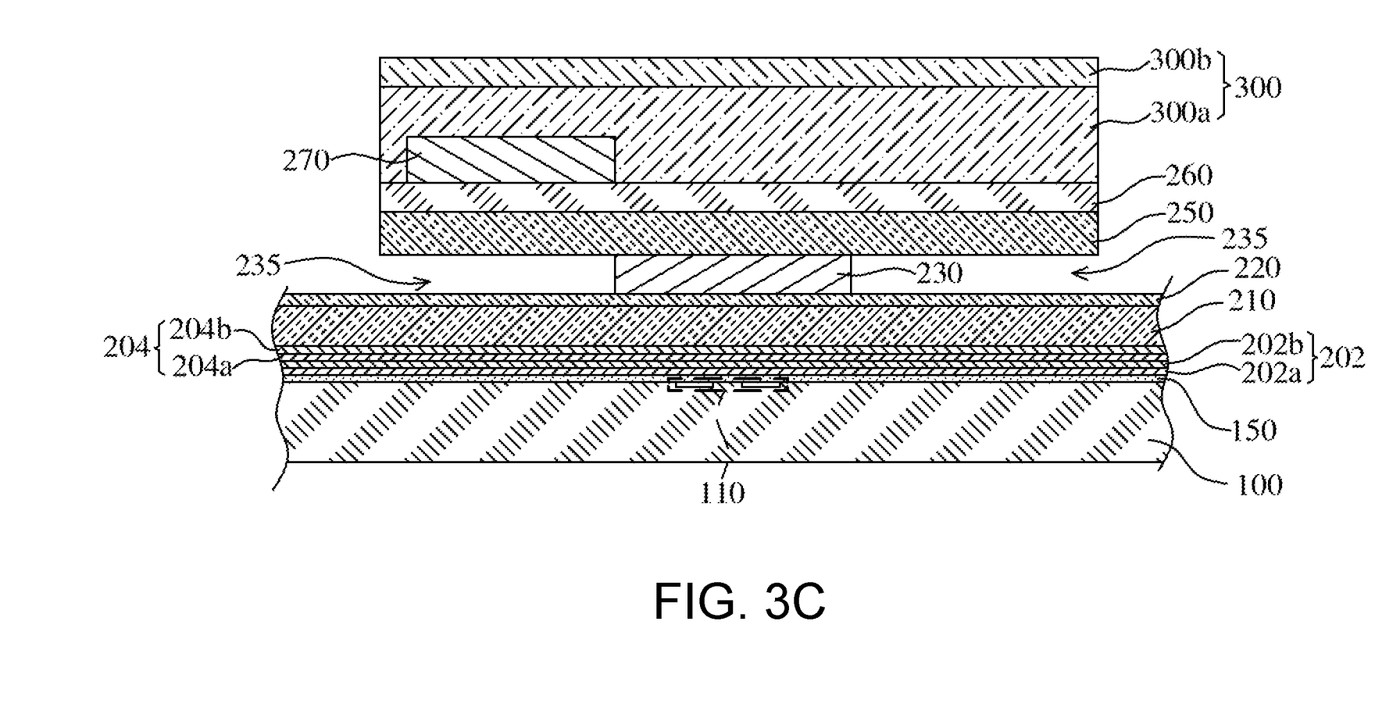

As shown in FIG. 3C, recesses 235 are formed on both sides of the waveguide layer 230 by using a characteristic that etchants/etching solutions have different etching rate for different materials. That is, an etchant/etching solution is selected according that the etchant/etching solution etches the waveguide layer 230 and less etches the first confining layer 220, the second confining layer 250, the cladding layer 260, and the etching barrier layer 300. The etchant/etching solution may be an acidic etchant such as an etchant containing phosphoric acid (H3PO4). After the recesses 235 are formed, the silicon dioxide layer 300a may also prevent deformation of the second confining layer 250 and the cladding layer 260, wherein the deformation is caused by the stress between the film layers.

Figure 3D:
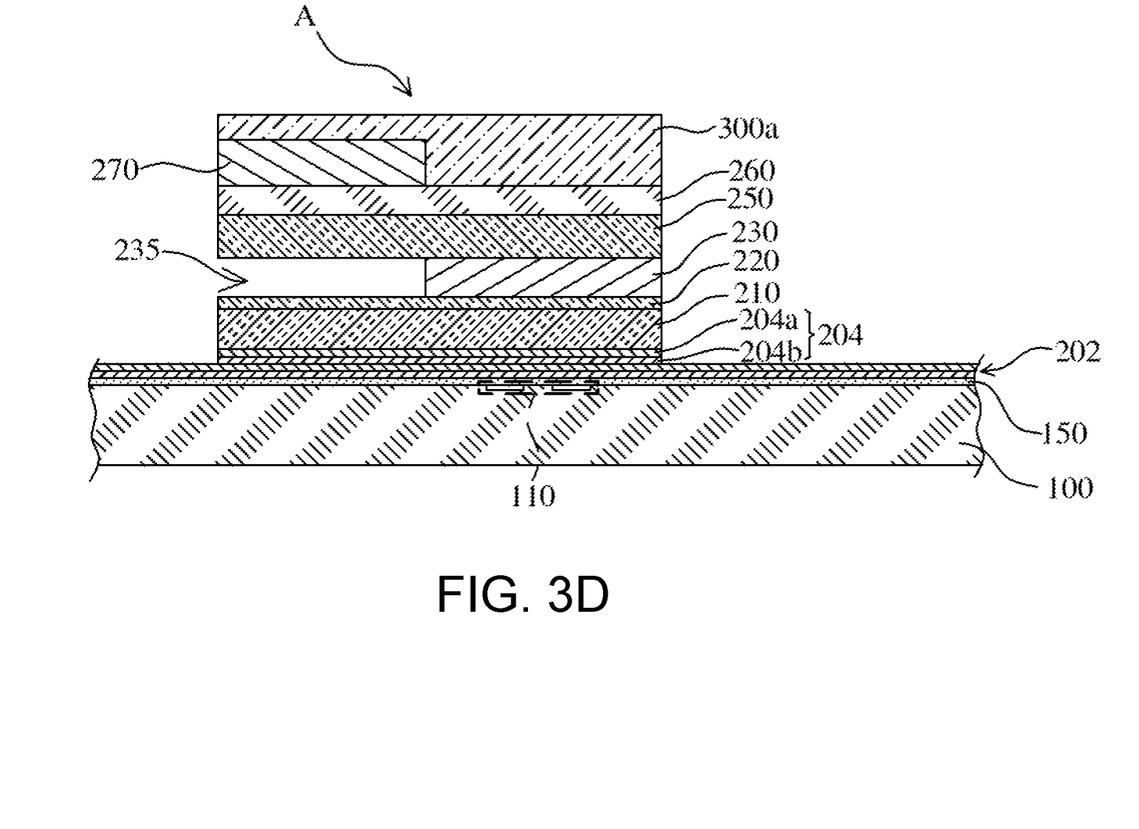

As shown in FIG. 3D, an optical waveguide region A is defined, and the second contact layer 204, the first-type semiconductor conductive layer 210, the first confining layer 220, the waveguide layer 230, the second confining layer 250, and the cladding layer 260 outside the optical waveguide region A are removed. One recess 235 is left in the optical waveguide region A, and the recess 235 corresponds to the second-type semiconductor conductive layer 270 and is under the second-type semiconductor conductive layer 270.

Figure 3E:
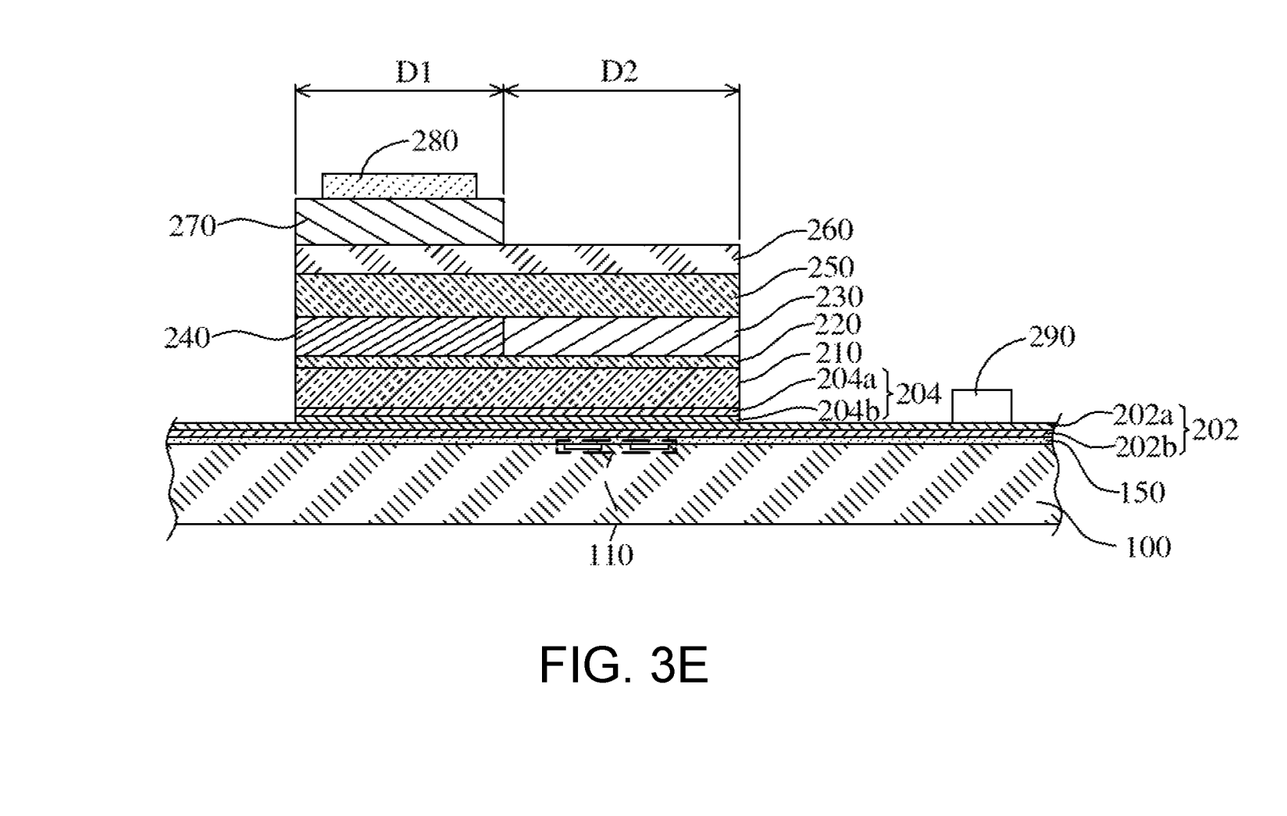

As shown in FIG. 3E, a polymer filling layer 240 is filled into the recess 235 by a spin coating technique, wherein a viscosity of the polymer filling layer 240 is less than 52 mm$^2$/s. The material of the polymer filling layer 240 may be PMGI. The polymer filling layer 240 with a viscosity coefficient that less than 52 mm$^2$/s provides excellent support after curing, thereby preventing the optical waveguide structure from collapsing.

After the polymer filling layer 240 is filled, a first electrode 280 is defined and formed on the first contact layer 202. The first electrode 280 may be a single-layer metal or a multi-layer metal, for example, the first electrode 280 is a multi-layer metal containing Ni/AuGe/Ni/Au. A second electrode 290 is defined and formed on the second-type semiconductor conductive layer 270. The second electrode 290 may be a single-layer metal or a multi-layer metal, for example, the second electrode 290 is a multi-layer metal containing Ti/Pt/Au. The polymer filing layer 240 has a first length D1, and the waveguide layer 230 has a second length D2. Further, the ratio of the first length D1 to the second length D2 is 6:4, for example, the first length D1 is 6 micrometers, and the second length D2 is 4 micrometers. Therefore, the optical waveguide structure of the present disclosure can transmit light to the grating 110 more efficiently.

Thus, an optical waveguide structure with well limitation of the light field is provided. And forming an undercut recess through different etching rates can also reduce the difficulty for shrinking the waveguide layer, thereby further reducing the footprint of the optical waveguide structure.

The terms "definition", "formation" and the like as used herein mean the use of thin film deposition techniques, lithography techniques, and etching techniques to form the desired pattern and area of each film layer. It should be understood that the thin film deposition technique may be physical vapor deposition, chemical vapor deposition, atomic layer deposition, or other similarly feasible methods. The etching technique may be dry etching, wet etching, or other feasible methods.

In view of the above, although the present invention has been disclosed by way of preferred embodiments, the above preferred embodiments are not intended to limit the present invention, and one of ordinary skill in the art, without departing from the spirit and scope of the invention, the scope of protection of the present invention is defined by the scope of the claims.

What is claimed is:

1. An optical waveguide structure, comprising:
   a substrate;
   a first-type semiconductor conductive layer disposed on the substrate;
   a first confining layer disposed on the first-type semiconductor conductive layer;
   a waveguide layer disposed on the first confining layer, and comprising a luminescent material;
   a polymer filling layer disposed on the first confining layer and adjacent to the waveguide layer, wherein a viscosity of the polymer filling layer is less than 52 mm$^2$/s;
   a second confining layer disposed on the waveguide layer and the polymer filling layer;
   a cladding layer disposed on the second confining layer; and
   a second-type semiconductor conductive layer disposed on the cladding layer.

2. The optical waveguide structure according to claim 1, wherein the material of the polymer filling layer comprises poly(methyl glutarimide).

3. The optical waveguide structure according to claim 1, wherein the material of the substrate comprises silicon, and the luminescent material comprises a III-V compound.

4. The optical waveguide structure according to claim 1, wherein the luminescent material comprises multiple quantum wells.

5. The optical waveguide structure according to claim 1, wherein the second-type semiconductor conductive layer is located within a vertical projection region of the polymer filling layer.

6. A manufacturing method of an optical waveguide structure, comprising steps of:
   providing a substrate and an optical waveguide substrate, wherein the optical waveguide substrate sequentially comprises: a first-type semiconductor conductive layer, a first confining layer, a waveguide layer, a second confining layer, a cladding layer, and a second-type semiconductor conductive layer;
   bonding the substrate and the optical waveguide substrate, wherein the first-type semiconductor conductive layer is adjacent to the substrate;
   forming a recess in a side of the waveguide layer;
   defining an optical waveguide region, and removing the first-type semiconductor conductive layer, the first confining layer, the waveguide layer, the second confining layer and the cladding layer disposed outside the optical waveguide region; and
   filing a polymer filling layer into the recess, wherein a viscosity of the polymer filling layer is less than 52 mm$^2$/s.

7. The manufacturing method of the optical waveguide structure according to claim 6, wherein the step of forming the recess in the side of the waveguide layer comprises a step of:
   forming the recess by an etching technique, wherein an etching rate of the etching technique to the waveguide layer is greater than an etching rate of the etching technique to the first confining layer.

8. The manufacturing method of the optical waveguide structure according to claim 6, wherein the step of bonding the substrate and the optical waveguide substrate comprises steps of:
   coating a bonding material on the substrate, wherein the bonding material comprises benzocyclobutene; and
   placing the optical waveguide substrate on the bonding material, and applying a bonding pressure onto the optical waveguide substrate.

9. The manufacturing method of the optical waveguide structure according to claim 7, wherein before forming the recess by the etching technique, further comprises a step of:
   forming a silicon dioxide layer on the cladding layer and the second-type semiconductor conductive layer.

10. The manufacturing method of the optical waveguide structure according to claim 6, wherein the step of forming the recess in the side of the waveguide layer comprises a step of:
    ensuring the recess corresponding to the second-type semiconductor conductive layer and under the second-type semiconductor conductive layer.

* * * * *